(12) United States Patent
Kurz et al.

(10) Patent No.: US 8,193,066 B2
(45) Date of Patent: Jun. 5, 2012

(54) SEMICONDUCTOR DEVICE COMPRISING A SILICON/GERMANIUM RESISTOR

(75) Inventors: Andreas Kurz, Dresden (DE); Roman Boschke, Dresden (DE); Christoph Schwan, Dresden (DE); John Morgan, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 166 days.

(21) Appl. No.: 12/477,365

(22) Filed: Jun. 3, 2009

(65) Prior Publication Data
US 2010/0025772 A1 Feb. 4, 2010

(30) Foreign Application Priority Data
Jul. 31, 2008 (DE) .......................... 10 2008 035 808

(51) Int. Cl.
*H01L 21/20* (2006.01)
(52) U.S. Cl. ................ 438/385; 438/382; 257/E27.016; 257/E21.004
(58) Field of Classification Search .................. 257/350, 257/358, 360, 379, 543, E27.016, E21.004; 438/382, 385
See application file for complete search history.

(56) References Cited

U.S. PATENT DOCUMENTS

| | | | | | |
|---|---|---|---|---|---|
| 3,765,940 | A | * | 10/1973 | Hentzschel | 438/385 |
| 5,837,592 | A | * | 11/1998 | Chang et al. | 438/382 |
| 6,400,252 | B1 | * | 6/2002 | Smith et al. | 338/308 |
| 7,422,972 | B2 | * | 9/2008 | Babcock et al. | 438/601 |
| 2006/0102964 | A1 | * | 5/2006 | Huang | 257/388 |
| 2007/0254449 | A1 | * | 11/2007 | Coolbaugh et al. | 438/382 |
| 2009/0236669 | A1 | * | 9/2009 | Chen et al. | 257/380 |

OTHER PUBLICATIONS

Translation of Official Communication from German Patent Office for German Patent Application No. 10 2008 035 808.8 dated Jun. 19, 2009.

* cited by examiner

*Primary Examiner* — Matthew Landau
*Assistant Examiner* — Colleen E Snow
(74) *Attorney, Agent, or Firm* — Williams, Morgan & Amerson, P.C.

(57) ABSTRACT

In integrated circuits, resistors may be formed on the basis of a silicon/germanium material, thereby providing a reduced specific resistance which may allow reduced dimensions of the resistor elements. Furthermore, a reduced dopant concentration may be used which may allow an increased process window for adjusting resistance values while also reducing overall cycle times.

4 Claims, 5 Drawing Sheets

FIG. 3d

SEMICONDUCTOR DEVICE COMPRISING A SILICON/GERMANIUM RESISTOR

BACKGROUND OF THE INVENTION

1. Field of the Invention

The present disclosure generally relates to the field of fabricating integrated circuits, and, more particularly, to resistors formed above the semiconductor layer in complex integrated circuits.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation to provide currently available integrated circuits with an improved degree of performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Although transistor elements are the dominant circuit element in highly complex integrated circuits which substantially determine the overall performance of these devices, other components, such as capacitors and resistors, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay. For example, in sophisticated applications, resistors may frequently be provided in the form of "integrated polysilicon" resistors, which may be formed above the semiconductor layer and/or respective isolation structures so as to obtain the desired resistance value without significantly contributing to parasitic capacitance, as may be the case in "buried" resistive structures which may be formed within the active semiconductor layer. A typical polysilicon resistor may thus require the deposition of the basic polysilicon material which may frequently be combined with the deposition of a polysilicon gate electrode material for the transistor elements. During the patterning of the gate electrode structures, the resistors may also be formed, the size of which may significantly depend on the basic specific resistance value of the polysilicon material and the subsequent type of dopant material and concentration that may be incorporated into the resistors so as to adjust the resistance values.

Since, typically, the resistance value of doped polysilicon material may be a non-linear function of the dopant concentration, thereby typically requiring specific implantation processes, independent of any other implantation sequences for adjusting the basic transistor characteristic, which may thus result in a moderately high complex manufacturing sequence. Furthermore, due to the ongoing shrinkage of the critical dimensions of the transistors, the resistor elements may also have to be reduced in size, while also typically requiring a reduction of the specific resistance, which in turn may necessitate the usage of higher dopant concentrations. For this reason, in conventional techniques, the demand for reduced specific resistance values of the basic resistor material in view of an overall size reduction of the lateral dimensions of the resistor elements is typically addressed by increasing the dopant dose, which may, however, require an over-proportionally long implantation time, since an increase of the dopant concentration may result in a significantly less pronounced increase of the conductivity due to the non-linear behavior. Furthermore, cycle times for the corresponding implantation processes may also cause increase of the overall process time and may thus contribute to the overall production costs. Therefore, frequently, a different dopant species may be used, which may allow reduced implantation times for a given desired high dopant concentration. In still other approaches, the lateral size of the resistors may be increased so as to obtain the desired resistance values for a given specific resistance, which, however, may not be compatible with the demand for reducing the overall dimensions of integrated circuits in order to provide a reduced chip size, thereby reducing overall production costs, or incorporating an increased amount of functions into a given chip area. In still other conventional approaches, the thickness of the basic polysilicon material may be increased so as to provide an increased cross-sectional area of the corresponding resistor elements, which, however, may require significant modifications of the overall process flow, in particular when polysilicon gate electrodes and the resistors may have to be formed in a common process flow.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which integrated resistor elements may be formed on the basis of a silicon/germanium mixture so as to provide a reduced sheet resistance of the basic material for forming the resistor elements. For this purpose, the silicon/germanium mixture may be deposited with a pre-defined fraction of germanium, possibly in combination with a specific dopant species, thereby providing the possibility of significantly increasing the range of resistor values that may be obtained during the subsequent manufacturing flow on the basis of reduced implantation cycle times. For example, by using a germanium fraction of approximately 5-50 percent, a corresponding reduction in sheet resistivity compared to polysilicon of approximately 25-50 percent may be accomplished for otherwise identical conditions, that is, for a given implantation dose and dopant species. Consequently, by using the silicon/germanium mixture for forming the resistor structure, the finally obtained resistor bodies may be provided with reduced dimensions, for instance with reduced lateral dimensions, while a height of the silicon/germanium resistor body may be selected so as to be compatible with the overall manufacturing flow for forming the transistor elements. Moreover, generally, a reduced implantation dose may be used in adjusting the target resistance value, which may result in overall reduction of cycle time and thus production costs. In other cases, the additional degree of freedom in adjusting the target resistance value provided by the incorporation of a germanium material into the silicon base material may enable, in combination with the incorporation of a certain concentration of a dopant during the deposition of the silicon/germanium material, completely avoiding any additional implantation processes, thereby also contributing to enhanced efficiency of the overall manufacturing flow. Moreover, in some illustrative aspects disclosed herein, the silicon/germanium mixture for the resistor elements may be advantageously used for the patterning of sophisticated gate electrode structures in which a high-k dielectric material may be used in combination with metal-containing gate electrode materials, thereby even further contributing to enhanced process efficiency.

One illustrative semiconductor device disclosed herein comprises a plurality of transistor elements and a resistor comprising a resistor body comprised of a doped silicon/germanium mixture.

One illustrative method disclosed herein relates to forming a resistive structure of a semiconductor device. The method comprises forming a silicon/germanium mixture in a transistor region and a resistor region. Furthermore, the method comprises patterning the silicon/germanium mixture to form a resistor body in the resistor region. Furthermore, a dopant species is introduced to adjust a specific resistance of the resistor body. Finally, the method comprises forming a contact element in the resistor body by incorporating a metal species.

A further illustrative method disclosed herein comprises forming a silicon/germanium mixture above a semiconductor layer of a semiconductor device to provide a gate electrode material and a resistor material in a common deposition process. The method additionally comprises forming a gate electrode structure and a resistor from the silicon/germanium mixture. Furthermore, at least a portion of the gate electrode structure is removed. Finally, at least a part of the removed portion is replaced by a metal-containing gate electrode material.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a cross-sectional view of the device of FIG. 1a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to semiconductor devices and methods of forming the same in which resistor elements may be formed in a highly efficient manner, for instance in terms of reduced cycle time, space efficiency, process margins and the like, by using a silicon/germanium material which may provide per se an increased conductivity compared to the conventionally used polysilicon material. As previously explained, an intrinsic silicon/germanium mixture may have an increased conductivity compared to intrinsic polysilicon material, wherein the specific resistance value may be adjusted on the basis of the fraction of germanium in the silicon/germanium mixture. For example, according to well-established deposition techniques, such as low pressure chemical vapor deposition (CVD), the ratio between silicon and germanium material may be efficiently controlled on the basis of the corresponding flow rates of precursor gases, thereby enabling, for a given basic deposition recipe, an adjustment of the desired basic specific resistance value. Consequently, the overall dimensions of a corresponding resistor element may be reduced compared to polysilicon-based resistor elements, while also a generally reduced dopant concentration may be required for finely tuning the desired resistance value. Consequently, even for overall reduced dimensions of the resistor elements, the generally lower dopant concentration may allow a wider range for adjusting the target resistance value during the manufacturing process, for instance by incorporating a corresponding dopant species, since at generally lower dopant concentrations, the effect of adding a dopant species on the resistance value may be higher compared to generally higher dopant concentrations as may have to be used in conventional approaches. Thus, enhanced flexibility in designing corresponding resistor elements may be provided, while at the same time efficiency of the overall manufacturing flow may be increased due to generally reduced cycle times during corresponding implantation processes. In other cases, the adjustment mechanism provided by selecting an appropriate germanium content in combination with an in situ doping may be required for appropriately tuning the target resistance values, thereby reducing overall process complexity since corresponding lithography processes, in combination with the associated implantation processes, may be omitted. Furthermore, in some illustrative embodiments, the provision of the silicon/germanium mixture may be efficiently implemented into the manufacturing flow for forming sophisticated gate electrode structures including high-k dielectric materials, in combination with metal-containing gate electrode materials, wherein the silicon/germanium mixture may be used as a place holder material in the gate electrode structure, which may be placed in a later manufacturing stage, while maintaining the silicon/germanium material in the resistor structures.

Figure 1A:
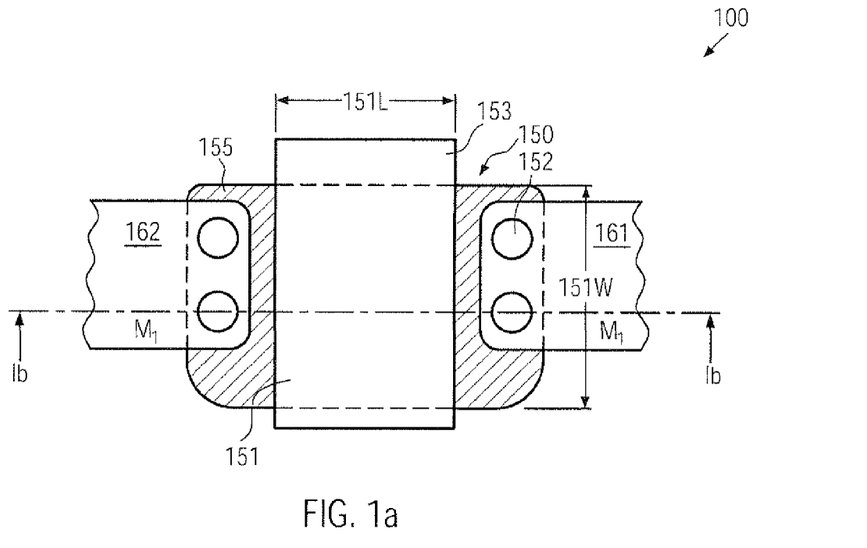
FIG. 1a schematically illustrates a top view of a semiconductor device comprising a resistor element formed on the basis of a silicon/germanium mixture, according to illustrative embodiments.

FIG. 1a schematically illustrates a top view of a semiconductor device 100 which comprises a resistor element 150 that is connected to a metallization level, that is, to respective metal lines 161, 162. The resistor 150 may comprise a resistor body 151 which may have specified lateral dimensions, such as a width 151W and a length 151L in accordance with overall design requirements. Furthermore, the resistor body 151 may have a specified height which may be selected so as to be compatible with the overall manufacturing flow for forming other circuit elements of the semiconductor device 100, such as gate electrode structures of transistors and the like. It should be appreciated that the lateral dimensions 151W and 151L may have to be determined on the basis of the desired height of the resistor body 151 and on the basis of the specific resistance value. The resistor body 151 may be comprised of a silicon/germanium mixture, that is, a material in which silicon atoms and germanium atoms may be statistically distributed so as to form the structure of the body 151, such as a polycrystalline structure. For example, the resistor body 151 may be comprised of the silicon/germanium mixture with an amount of approximately 5-50 atomic percent germanium, wherein 100 percent refers to the silicon contents and the germanium contents of the body 151. It should be appreciated that other components may also be present in the resistor body 151, however, to a significantly less pronounced degree, for instance in the form of dopant species, traces of impurities or any other species that may intentionally be incorporated in order to finely tune the electrical behavior of the resistor body 151. For instance, the specific resistance of the body 151 may range from approximately 150-500 Ohm×micrometer.

Moreover, the resistor 150 may comprise a contact area 155, which may comprise any appropriate material providing a low sheet resistance, such as a metal-containing material forming a compound with at least one of the components of the body 151. For example, a metal silicide, for instance in the form of nickel silicide, cobalt silicide, cobalt silicide, platinum silicide and the like, may be used to provide a reduced sheet resistance of the contact area 155. Furthermore, contact elements 152, for instance in the form of tungsten elements and the like, depending on the process technology considered, may provide a highly conductive connection between the corresponding contact areas 155 and the metal lines 161, 162. Furthermore, as illustrated, a cap layer 153, for instance comprised of any appropriate dielectric material, such as silicon nitride, silicon dioxide and the like, may be provided to cover the resistor body 151, thereby defining the lateral dimensions 151W, 151L and also defining the lateral size of the contact areas 155.

Figure 1B:
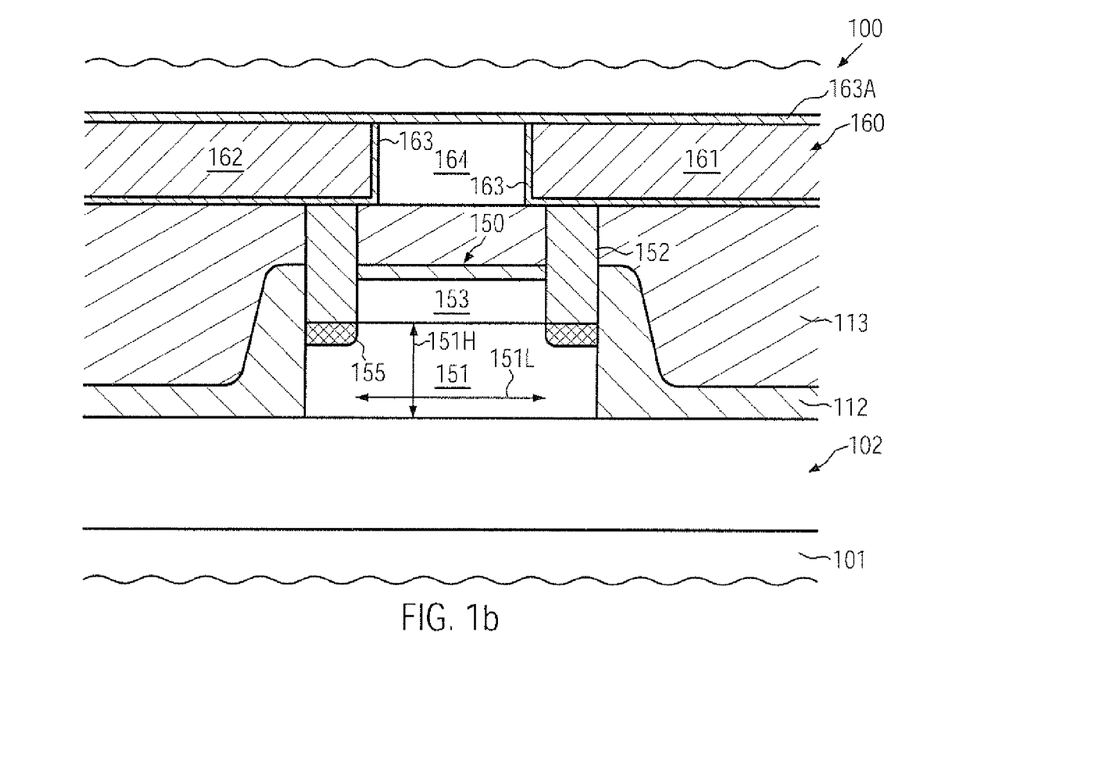

FIG. 1b schematically illustrates a cross-sectional view of the semiconductor device 100 of FIG. 1a along the line 1b. As illustrated, the semiconductor device 100 may comprise a substrate 101, which may represent any appropriate carrier material for forming thereabove a device layer 102, which may be understood as a semiconductor layer in combination with respective isolation structures (not shown) so as to form in and above the layer 102 circuit elements, such as transistors, capacitors and the like, and also one or more of the resistors 150. The substrate 101, in combination with the layer 102, may define a bulk configuration when the semiconductor material portions of the layer 102 may represent an upper part of a crystalline material of the substrate 101. In other cases, the substrate 101, in combination with the layer 102, may represent a silicon-on-insulator (SOI) configuration when the substrate 101 comprises, at least locally, an insulating surface portion in the form of a buried insulating layer (not shown). It should be appreciated that a resistor 150 may be formed above a semiconductor area and may then be separated therefrom by a thin insulating layer (not shown), while, in other cases, the resistor 150 may be formed above an isolation structure, such as a shallow trench isolation (not shown) and the like.

Moreover, the resistor 150 and also other circuit elements may be enclosed by an interlayer dielectric material 113, in combination with a cap layer or etch stop layer 112. The interlayer dielectric material 113 may be comprised of any appropriate material, such as silicon dioxide and the like. Furthermore, a first metallization level 160 may be formed above the interlayer dielectric material 113 and may comprise the metal lines 161, 162, which may be embedded in an appropriate dielectric material 164, such as a low-k dielectric material if sophisticated semiconductor devices are considered. A low-k dielectric material is to be understood as a dielectric material having a dielectric constant of 3.0 or less. In some illustrative embodiments, the metallization level 160 may be formed on the basis of copper material, thereby requiring a barrier material 163, for instance in the form of a conductive barrier material, while, in some cases, a dielectric barrier material 163A may be formed on top of the metal lines 161, 162 to provide the desired copper confinement. It should be appreciated that the semiconductor device 100 may comprise further metallization levels, depending on the overall complexity of the basic circuit layout.

The semiconductor device 100 as shown in FIGS. 1a and 1b may be formed on the basis of the following processes. After defining basic active regions in the device level 102, which may include the formation of a trench isolation structure, a silicon/germanium material for the body 151 may be formed, for instance by low pressure CVD and the like. It should be appreciated that, prior to, during or after the deposition of the corresponding material, a gate electrode material and a gate dielectric material may be formed in other device areas in which corresponding transistor elements are to be formed, as will be explained later on in more detail. The deposition of the silicon/germanium mixture may be performed so as to control the fraction of germanium to be within a range of approximately 5-50 atomic percent, depending on the desired specific resistance value. As previously discussed, in some illustrative embodiments, the silicon/germanium material may be deposited so as to include a specific dopant species, such as boron, phosphorous and the like, thereby obtaining a specified specific resistance value, which may or may not be modified in the later manufacturing stage, depending on the overall process strategy. Thereafter, the silicon/germanium material may be patterned, possibly in combination with gate electrode structures of transistor elements and the like, which may be accomplished by using well-established lithography and etch techniques, wherein a corresponding dimension 151W, 151L may be defined depending on the design rules and the required resistance value. Furthermore, as previously indicated, when selecting the lateral dimensions 151W, 151L, a height 151H of the material 151 may also be taken into consideration. That is, in general, reducing the lateral dimensions 151L, 151W for a given height 151H may require an increased fraction of germanium and/or dopant species for a required resistance value of the resistor 150. After the patterning of the body 151, additional implantation processes, if required, may be performed which may be accomplished on the basis of a specifically designed implantation mask when the implantation dose and energy as well as implantation species may not be compatible with the corresponding parameters used for forming other circuit elements, such as transistors and the like. It should be appreciated that, during the preceding manufacturing flow, the cap layer 153 may have been formed and may still be present on top of the patterned body 151, therefore an appropriate patterning process may be performed so as to expose the contact areas 155, thereby effectively determining the lateral dimensions 151L, 151W. Thereafter, the silicidation process may be performed in which a refractory metal, such as nickel, platinum and the like, may be deposited and a chemical reaction may be initiated so as to form a metal-containing portion, while a cap layer 153 may act as a mask. Thereafter, the layers 112 and 113 may be formed in accordance with well-established deposition techniques, followed by a pattern sequence to form the contact elements 152, in combination with other contact elements that connect to contact areas of other circuit elements, such as transistors and the like. Next, the metallization lay 160 may be formed, for instance by depositing the dielectric material 164 and patterning the same so as to receive respective trenches which may subsequently be filled by an appropriate metal, such as copper, possibly in combination with the conductive barrier material 163. For this purpose, well-established process techniques are available. Finally, the cap layer 163A may be deposited and further metallization levels, if required, may be formed.

Consequently, the resistor 150 may be provided with a moderately low dopant concentration due to the intrinsically reduced specific resistance of the silicon/germanium mixture in the body 151.

Figure 2A:
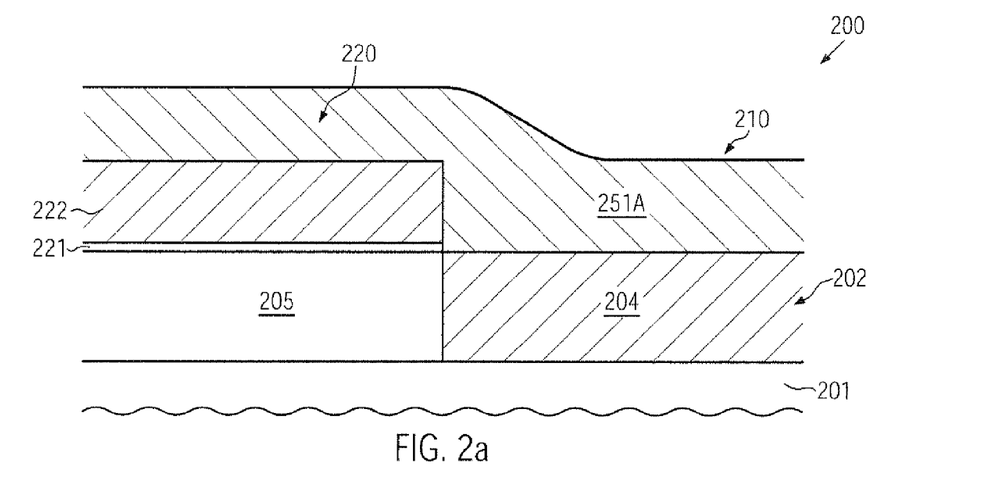
FIGS. 2a-2c schematically illustrate cross-sectional views of a semiconductor device during various manufacturing stages in forming transistor elements and a resistor by using a silicon/germanium mixture by providing a different gate electrode material for the transistors, according to illustrative embodiments.
Figure 2B:
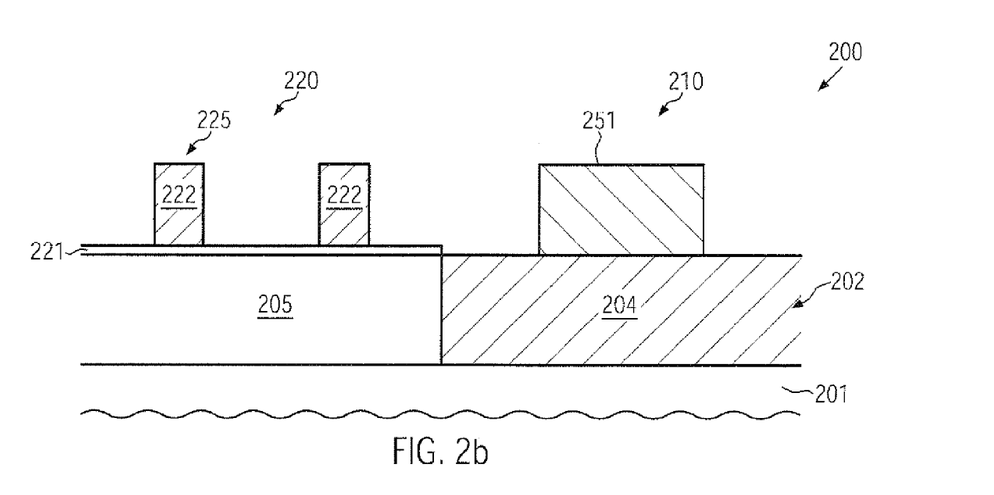
Figure 2C:
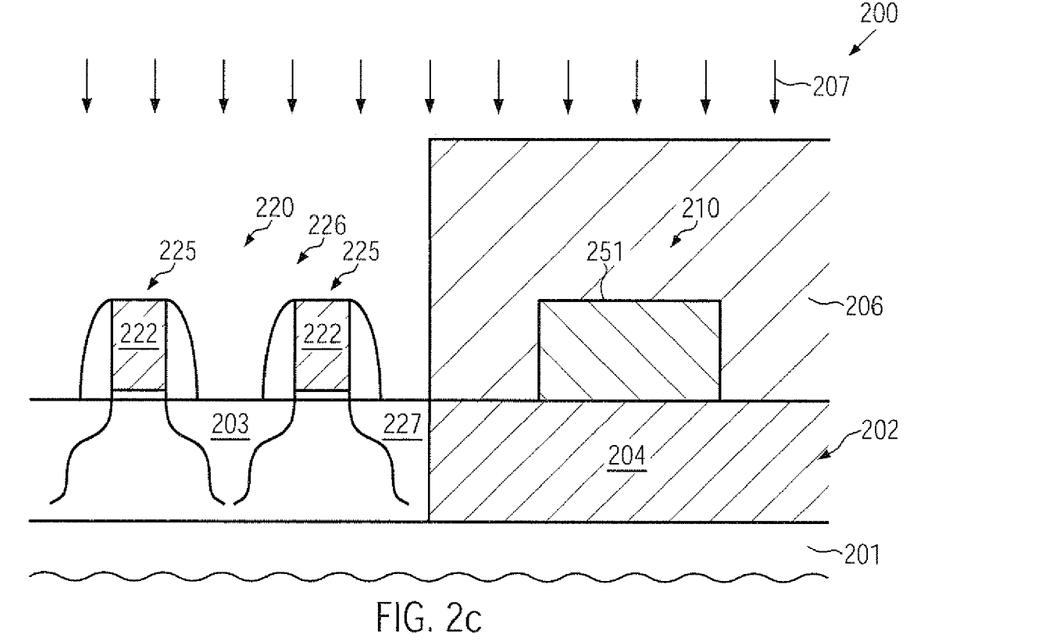

With reference to FIGS. 2a-2c, further illustrative embodiments will now be described in which a process sequence may be used for forming gate electrodes and the resistors on the basis of different materials.

FIG. 2a schematically illustrates a semiconductor device 200 comprising a substrate 201 and a device layer 202. For the components 201 and 202, the same criteria apply as previously explained when referring to the semiconductor device 100. Furthermore, the semiconductor device 200 may comprise a resistor region 210, in which one or more resistors may have to be formed, and may also comprise a device region 220, in which other circuit components, such as transistors, are to be formed. For example, the device region 220 may represent an active region 205, i.e., a semiconductor region of the device layer 202, in which an appropriate dopant profile may have to be established so as to obtain a specific conductivity therein. On the other hand, an isolation structure 204 may be provided in the resist region 210. Furthermore, in the manufacturing stage shown, a gate dielectric material 221 may be formed at least above the active region 205, while in other cases the gate dielectric material 221 may also be formed above the isolation structure 204, depending on the type of material used and the corresponding manufacturing technique. Furthermore, a gate electrode material 222, such as polysilicon and the like, may be formed above the active region 205 and may also extend into the isolation structure 204 (not shown), if required. Furthermore, a resistor material 251A in the form of a silicon/germanium mixture may be formed in the regions 220 and 210. With respect to the characteristics of the material 251A, for instance with respect to germanium contents, dopant concentration, thickness and the like, the same criteria may apply as previously explained with reference to the device 100.

The semiconductor device 200 as shown in FIG. 2a may be formed on the basis of the following processes. After forming the isolation structure 204 by using well-established process techniques, the gate dielectric material 221 may be formed, for instance by oxidation and/or deposition and the like. Thereafter, the gate electrode material 222 may be deposited, for instance in the form of a polysilicon material using well-established deposition recipes. Thereafter, an unwanted portion of the gate electrode material 222 may be removed from above the resistor region 210, or at least a portion thereof when the gate electrode material 222 is to extend into the resistor region 210. For this purpose, lithography techniques and selective etch recipes may be used. Thereafter, the material 251A may be deposited using process techniques as previously described. Thereafter, the material 251A may be removed from above the material 222, which may be accomplished by chemical mechanical polishing (CMP), possibly in combination with etch techniques and the like.

FIG. 2b schematically illustrates the semiconductor device 200 in a further advanced manufacturing stage. As illustrated, a plurality of gate electrode structures 225 of transistors to be formed in and above the active region 205 may be provided, while a resistor body 251 may be formed in the resistor region 210. Thus, the gate electrode structures 225 may comprise a gate electrode material 222 and the gate dielectric material 221, while the resistor body 251 may be comprised of the silicon/germanium mixture. In some illustrative embodiments, the gate electrode structures 225 and the resistor body 251 may be patterned in a common patterning regime, since the materials 222 and 251A may have a similar etch behavior with respect to a plurality of well-established recipes for patterning polysilicon gate electrode structures.

FIG. 2c schematically illustrates the semiconductor device 200 according to illustrative embodiments in which the resistor material 251 may have incorporated therein an appropriate germanium concentration and dopant concentration so as to not require any additional resistance adjustment on the basis of an implantation process. Consequently, during respective implantation processes 207 for forming drain and source regions 227 of transistors 226 in the device region 220, the resistor region 210 may be protected by an implantation mask 206 without requiring any specifically designed implantation masks prior to or after the implantation sequence 207 for adjusting the specific resistance of the body 251. That is, due to the high degree of freedom in selecting the specific resistance value on the basis of the germanium contents and the dopant species that may be incorporated by depositing the material 251A (FIG. 2a), additional implantation processes and the corresponding lithography steps associated therewith may be omitted, thereby obtaining a highly efficient manufacturing flow. Thereafter, the further processing may be continued by completing the transistors 226, for instance by forming metal silicide regions providing strain-inducing dielectric materials when sophisticated applications are considered. For instance, the transistors 226 may represent speed-critical transistors having a gate length, i.e., in FIG. 2c, the horizontal extension of the gate electrode material 222, of approximately 50 nm and less, which may be required in sophisticated integrated circuits, such as CPU cores and the like. On the other hand, the resistor body 251 may be processed in a similar manner as is described with reference to the semiconductor device 100.

With reference to FIGS. 3a-3d, further illustrative embodiments will now be described in which gate electrode structures may be formed on the basis of a silicon/germanium mixture, which may at least partially be replaced in the gate electrode structures at a later manufacturing stage.

Figure 3A:
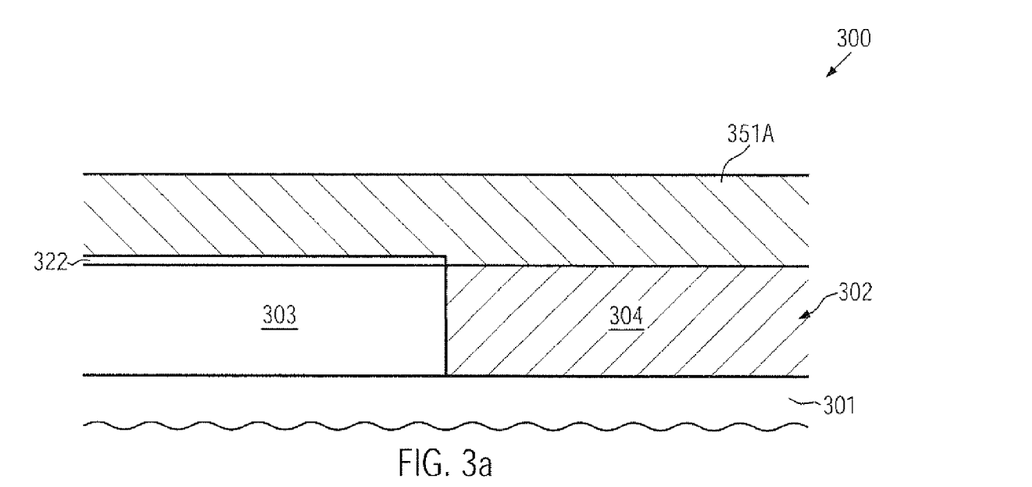
FIGS. 3a-3d schematically illustrate cross-sectional views of a semiconductor device during various manufacturing stages in forming transistor elements comprising sophisticated gate electrode structures based on a high-k dielectric material while also forming resistor elements using a silicon/germanium mixture, according to further illustrative embodiments.

FIG. 3a schematically illustrates a semiconductor device 300 comprising a substrate 301 and a device layer 302. Furthermore, an isolation structure 304 and one or more active regions 303 may be defined in the device layer 302. With respect to these components, the same criteria may apply as previously explained with reference to the devices 100 and 200. Furthermore, a gate dielectric material 322 may be formed at least above the active region 303 and a silicon/germanium mixture 351A may be formed above the device layer 302. With respect to the characteristics of the gate dielectric material 322 and the silicon/germanium material 351A, it may be referred to the device 200.

Figure 3B:
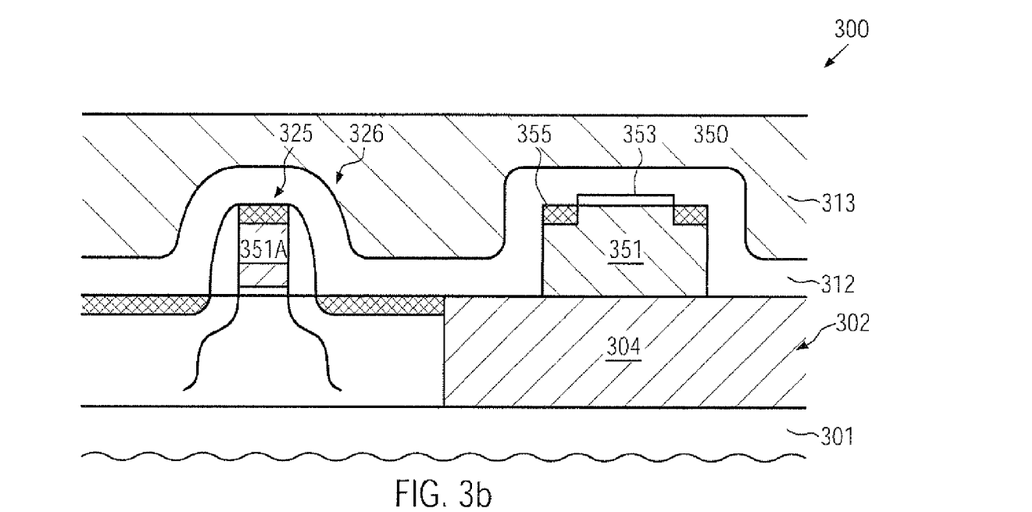

FIG. 3b schematically illustrates the semiconductor device 300 in a further advanced manufacturing stage. As illustrated, a transistor 326 including a gate electrode structure 325 formed on the basis of the material 351A may be formed in and above the active region 303, while a resistor 350 may be formed above the isolation structure 304. The resistor 350 may comprise a cap layer 353, which may substantially define the lateral dimensions, as previously explained with reference to the resistor 150. Furthermore, contact areas 355 may be provided, for instance in the form of a silicide and the like. Furthermore, the transistor 326 and the resistor 350 may be enclosed by a dielectric material 312 and 313, for instance in the form of silicon nitride and silicon dioxide and the like.

The device 300 may be formed by well-established manufacturing techniques wherein however, contrary to conventional approaches, the gate electrode structure 325 may be formed on the basis of the material 351A.

Figure 3C:
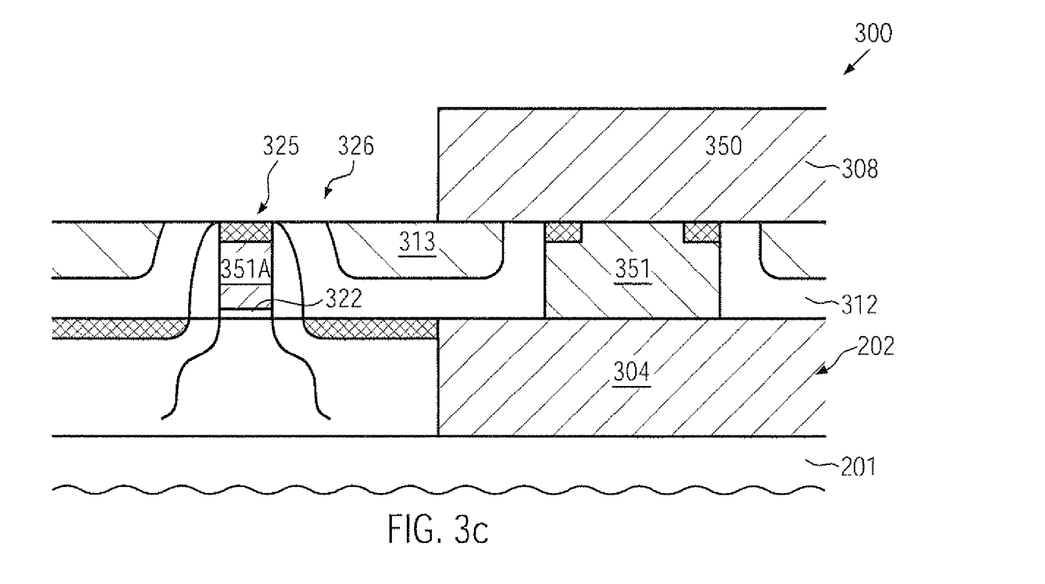

FIG. 3c schematically illustrates the semiconductor device 300 in a further advanced manufacturing stage in which the gate electrode structure 325 may be exposed, while the resistor 350 may be covered by an appropriate mask 308, such as a resist mask and the like. For example, excess material of the layer 313 may be removed by CMP, thereby also exposing the gate electrode 325 and the resistor 350. Thereafter a respective lithography step may be performed so as to provide the mask 308. Next, a selective etch process may be performed to remove the gate electrode material 351A, possibly in combination with any metal silicide region, for which well-established etch recipes may be used. For instance, similar etch techniques as previously used for patterning the gate electrode 325 may be applied. Thereafter, if desired, the gate dielectric material 322 may be removed and may be replaced by a high-k dielectric material, which is to be understood as a dielectric material having a dielectric constant of 10.0 or higher. For example, hafnium oxide, zirconium oxide and the like may represent appropriate high-k dielectric materials. Thereafter, an appropriate metal-containing material, such as titanium nitride and the like, may be filled into the gate electrode structure 325, thereby providing enhanced performance of the gate electrode structure 325.

Figure 3D:
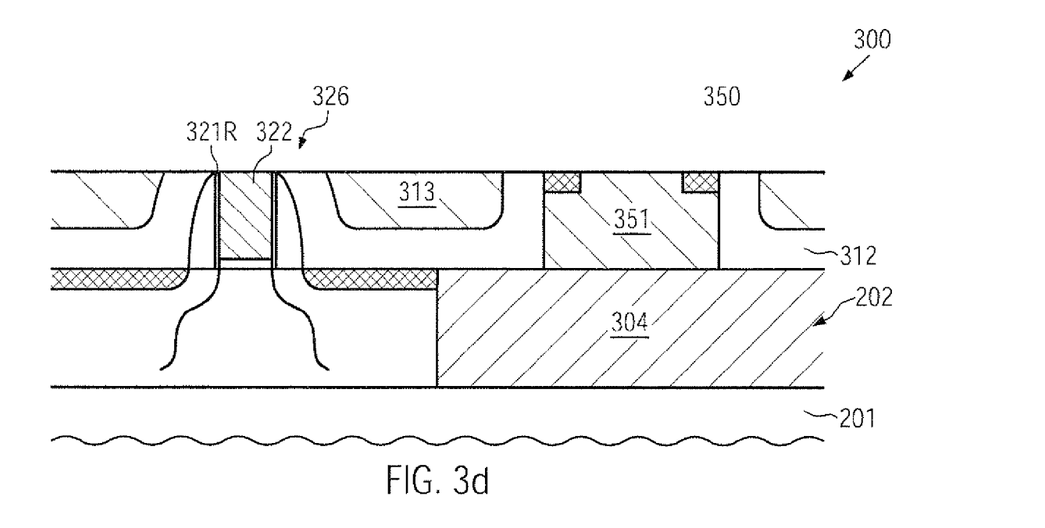

FIG. 3d schematically illustrates the semiconductor device 300 after the above-described process sequence wherein also any excess material may be removed, for instance by CMP and the like. Hence, a high-k dielectric material 321R may be formed in the gate electrode structure 325 in combination with a metal-containing material 322. On the other hand, the resistor 350 may not be substantially affected by the preceding process sequence for forming the sophisticated gate electrode structure 326. Consequently, advanced transistor elements may be provided in combination with the resistor 350 without unduly adding to overall process complexity, since the initial gate electrode structure 325 and the resistor 350 may be formed on the basis of the same silicon/germanium material.

As a result, the present disclosure provides semiconductor devices and techniques for forming the same in which integrated resistors may be formed on the basis of a silicon/germanium material, thereby providing increased specific resistance of the material, which may thus allow the reduction of the overall dimensions of the resistor, even at a reduced dopant concentration. Thus, overall cycle time may be reduced, while also a highly space-efficient circuit design may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a resistive structure and a gate electrode structure of a semiconductor device, the method comprising:

forming a gate insulation layer above a transistor region;

forming a layer of gate electrode material at least above said gate insulation layer;

forming a layer of a silicon/germanium mixture on an isolation structure in a resistor region and above said layer of gate electrode material, said gate electrode material being a material other than said silicon/germanium mixture;

removing portions of said silicon/germanium mixture from above said layer of gate electrode material;

after removing said portions of said silicon/germanium mixture, patterning said layer of gate electrode material and said layer of silicon/germanium mixture so as to form, respectively, a gate electrode in said transistor region and a resistor body in said resistor region;

introducing a dopant species into said resistor body so as to adjust a specific resistance of said resistor body; and forming a contact element in said resistor body by incorporating a metal species.

2. The method of claim 1, wherein said dopant species is at least partially introduced when forming said silicon/germanium mixture.

3. The method of claim 1, wherein said dopant species is at least partially introduced by ion implantation.

4. The method of claim 1, wherein forming said layer of gate electrode material comprises depositing a polysilicon material.

* * * * *